US012686947B2

(12) United States Patent
Nishihara

(10) Patent No.: US 12,686,947 B2
(45) Date of Patent: Jul. 21, 2026

(54) SiC INGOT AND SiC WAFER

(71) Applicant: SHOWA DENKO K.K., Tokyo (JP)

(72) Inventor: Yoshitaka Nishihara, Chichibu (JP)

(73) Assignee: Resonac Corporation, Tokyo (JP)

( * ) Notice: Subject to any disclaimer, the term of this patent is extended or adjusted under 35 U.S.C. 154(b) by 897 days.

(21) Appl. No.: 17/965,965

(22) Filed: Oct. 14, 2022

(65) Prior Publication Data

US 2023/0122232 A1 Apr. 20, 2023

(30) Foreign Application Priority Data

Oct. 18, 2021 (JP) ................................. 2021-170268

(51) Int. Cl.
*C30B 29/66* (2006.01)
*C30B 29/36* (2006.01)
(52) U.S. Cl.
CPC .............. *C30B 29/66* (2013.01); *C30B 29/36* (2013.01)
(58) Field of Classification Search
None
See application file for complete search history.

(56) References Cited

U.S. PATENT DOCUMENTS

2011/0206929 A1* 8/2011 Nakabayashi .......... C30B 23/00
                                                                    252/516
2016/0236375 A1* 8/2016 Hori ........................ C30B 33/06

FOREIGN PATENT DOCUMENTS

| CN | 103422174 | A | | 12/2013 | |
| CN | 105525350 | A | | 4/2016 | |
| CN | 112760719 | A | * | 5/2021 | ............. C30B 29/36 |
| JP | 2006290635 | A | * | 10/2006 | |
| JP | 3917154 | B2 | | 5/2007 | |
| JP | 2008074663 | A | * | 4/2008 | |
| JP | 2011-251885 | A | | 12/2011 | |
| JP | 2014-231463 | A | | 12/2014 | |
| JP | 5633099 | B1 | | 12/2014 | |
| JP | 2021-038106 | A | | 3/2021 | |

* cited by examiner

*Primary Examiner* — Xiaobei Wang
(74) *Attorney, Agent, or Firm* — Sughrue Mion, PLLC

(57) ABSTRACT

A SiC ingot includes a seed crystal and a single crystal grown on the seed crystal, wherein the single crystal has therein a micropipe passing through the single crystal in a growth direction, and when photoluminescence observation is performed on a plurality of wafers cut out from the single crystal in a direction intersecting the growth direction, an S/N ratio of the micropipe in a first wafer cut out of the plurality of wafers, which is closest to the seed crystal, is higher than an S/N ratio of the micropipe in a second wafer cut out from a position further away from the seed crystal than the first wafer.

8 Claims, 3 Drawing Sheets

SiC INGOT AND SiC WAFER

BACKGROUND OF THE INVENTION

Field of the Invention

The present disclosure relates to a SiC ingot and a SiC wafer.

Priority is claimed on Japanese Patent Application No. 2021-170268, filed on Oct. 18, 2021, the content of which is incorporated herein by reference.

Description of Related Art

Silicon carbide (SiC) has a dielectric breakdown electric field which is one order of magnitude larger than that of silicon (Si) and has a band gap which is three times larger than that of silicon (Si). In addition, silicon carbide (SiC) has properties such as a thermal conductivity which is about three times as high as that of silicon (Si). Thus, it is expected that silicon carbide (SiC) will be applied to power devices, high-frequency devices, high-temperature operation devices, and the like. Therefore, in recent years, SiC epitaxial wafers have come to be used for the semiconductor devices as described above.

SiC epitaxial wafers are produced by growing SiC epitaxial films, which will be active regions of SiC devices, on SiC wafers through chemical vapor deposition (CVD) methods.

SiC wafers are prepared by cutting SiC ingots. The cut SiC wafers are subjected to grinding, polishing, and the like. Furthermore, in order to confirm which position of which ingot the SiC wafers was cut from, markers are applied for manufacturing control.

Defect measurement using photoluminescence is performed for quality control of SiC wafers (for example, Patent Literatures 1 and 2). One of the defects specified using photoluminescence is a micropipe. For example, Patent Literature 2 describes that a micropipe is observed as a dark spot in photoluminescence measurement.

Before marking a SiC wafer, a SiC wafer may be replaced in some cases. In this case, a predetermined marker is provided to an inappropriate SiC wafer which is not preferable in terms of manufacturing control.

Patent Documents

[Patent Literature 1] Japanese Patent No. 5633099
[Patent Literature 2] Japanese Patent No. 3917154

SUMMARY OF THE INVENTION (1) A first aspect of the present disclosure provides a SiC ingot including a seed crystal and a single crystal grown on the seed crystal, wherein the single crystal has therein a micropipe passing through the single crystal in a growth direction, and when photoluminescence observation is performed on a plurality of wafers cut out from the single crystal in a direction intersecting the growth direction, an S/N ratio of the micropipe in a first wafer cut out of the plurality of wafers, which is closest to the seed crystal, is higher than an S/N ratio of the micropipe in a second wafer cut out from a position further away from the seed crystal than the first wafer.

(2) In the SiC ingot according to the above aspect, the closer the wafer is cut from the seed crystal, the higher the S/N ratio of the micropipe in the wafer may be.

(3) The SiC ingot according to the above aspect may further includes impurities, wherein the impurities are one or more of nitrogen, boron, aluminum, titanium, and vanadium, and a total impurity concentration of the impurities in the first wafer is higher than that in the second wafer.

(4) In the SiC ingot according to the above aspect, the closer the wafer is cut from the seed crystal, the higher the total impurity concentration in the wafer may be.

(5) In the SiC ingot according to the above aspect, the total impurity concentration of the first wafer may be $1\times10^{14}$ $cm^{-3}$ or more and the total impurity concentration of the second wafer may be $2\times10^{19}$ $cm^{-3}$ or less.

(6) In the SiC ingot according to the above aspect, a diameter of the single crystal may be 150 mm or more.

(7) In the SiC ingot according to the above aspect, a diameter of the single crystal may be 200 mm or more.

(8) A SiC wafer according to a second aspect is cut out from the SiC ingot according to the above aspect.

(9) In the SiC wafer according to the above aspect, the density of the micropipes may be 0.003 $cm^{-2}$ or more and 10 $cm^{-2}$ or less.

DETAILED DESCRIPTION OF THE INVENTION

Figure 1:
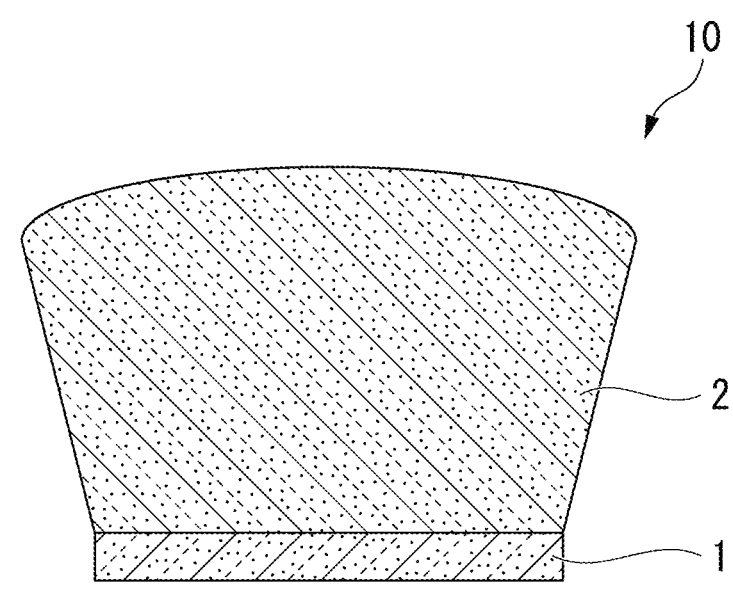
FIG. 1 is a schematic diagram of a SiC ingot according to an embodiment.

Embodiments will be described in details below with appropriate reference to the drawings. In the drawings used in the following explanations, in order to make it easier to understand the features of the present disclosure, enlarged characteristic parts may be provided for convenience in some cases and the dimensional ratios of constituent elements may differ from the actual ones in some cases. The materials, the dimensions, and the like exemplified in the following description are examples and the present disclosure is not limited to them and can be modified as appropriate without changing the gist of the disclosure.

FIG. 1 is a schematic diagram of a SiC ingot 10 according to a first embodiment. The SiC ingot 10 includes a seed crystal 1 and a single crystal 2. Hereinafter, a height direction of the single crystal 2 will be referred to as a z direction. The z direction is an example of a growth direction of the single crystal 2. Two directions orthogonal to the z direction and orthogonal to each other are referred to as an x direction and a y direction. Furthermore, a plane extending in the x direction and the y direction is referred to as an xy plane.

The seed crystal 1 is SiC. A growth plane of the seed crystal 1 facing a raw material may or may not have an offset angle with respect to a crystal plane. When the growth plane has an offset angle, the offset angle is, for example, 2° or more and 8° or less. The single crystal 2 is grown on the seed crystal 1. The single crystal 2 is SiC. A diameter of the single crystal 2 when the single crystal 2 is viewed from the z direction is, for example, 150 mm (6 inches) or more, and preferably 200 mm (8 inches) or more.

Figure 2:
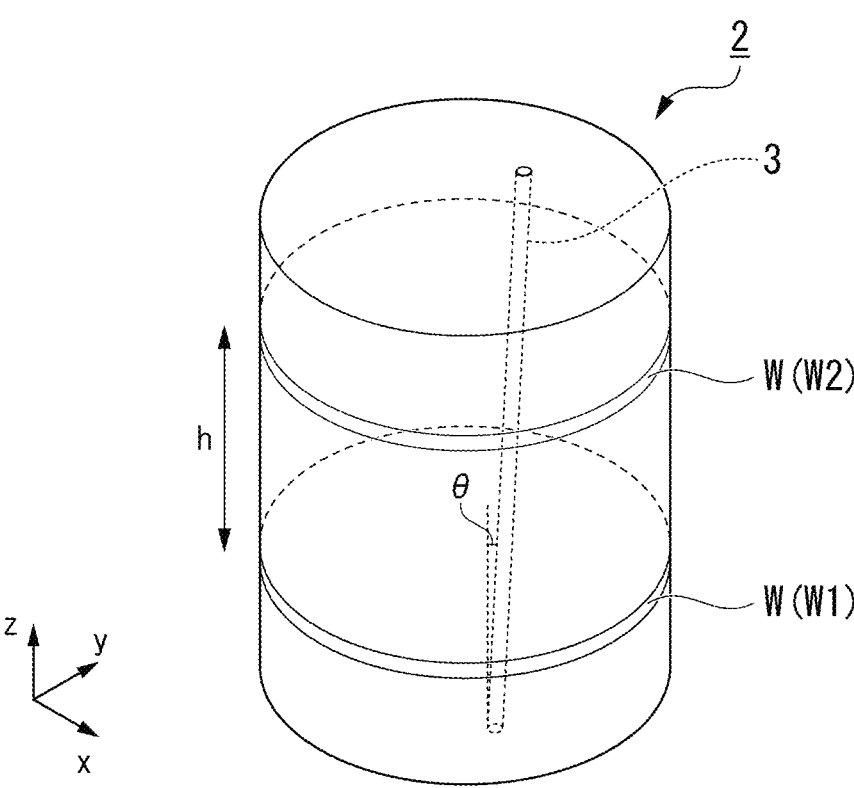
FIG. 2 is a schematic diagram of a characteristic part of a single crystal.

FIG. 2 is a schematic diagram of a characteristic part of the single crystal 2 in the SiC ingot 10. The single crystal 2 has a micropipe 3 therein. Although FIG. 2 shows a case in which the number of micropipes 3 is only one, the number of micropipes 3 is not limited to one. The micropipe 3 extends in the growth direction of the single crystal 2. The micropipe 3 passes through a part of the single crystal 2 in the z direction. Although there are defects originating from an interface between the seed crystal 1 and the single crystal 2 and threading defects originating from bulk growth which originates from a point inside the single crystal 2 (point other than the interface between the single crystal 2 and the seed crystal) in the micropipe 3, there is a high proportion of threading defects originated from the seed crystal.

The micropipe 3 may be formed in the growth direction of the single crystal 2 in many cases. For example, when the seed crystal 1 having an offset angle is used, the micropipe 3 may be inclined with respect to the z direction of the single crystal 2 in many cases. An inclination angle θ of the micropipe 3 with respect to the z direction matches, for example, the offset angle. When the seed crystal 1 does not have an offset angle, the inclination angle θ is, for example, 0°.

Since the micropipe 3 passes through the single crystal 2 in the growth direction, the micropipe 3 is confirmed in each wafer W cut out from the single crystal 2. The wafers W are, for example, cut out parallel to the xy plane. Furthermore, the wafer W may be cut out to be inclined with respect to the xy plane.

The plurality of wafers W can be acquired from the single crystal 2. A diameter of each of the waters W is, for example, 150 mm (6 inches) or more, and preferably 200 mm (8 inches) or more. Each of the wafers W is processed into a SiC device after growing a SiC epitaxial film on the wafer W. A density of the micropipes 3 in the wafer W is, for example, 0.003 cm$^{-2}$ or more and 10 cm$^{-2}$ or less. Hereinafter, among the plurality of wafers W cut out from the single crystal 2, a wafer cut out from the single crystal 2 closest to the seed crystal 1 is referred to as a first wafer W1 and a wafer cut out from the single crystal 2 at a position further away from the seed crystal 1 than the first wafer W1 is referred to as a second wafer W2.

Photoluminescence images of the micropipe 3 differ between the first wafer W1 and the second wafer W2. An S/N ratio of the micropipe 3 in the first wafer W1 is higher than an S/N ratio of the micropipe 3 in the second wafer W2. An S/N ratio is a ratio of emission intensities of photoluminescence light between a center of a defect and the periphery of the defect. The emission intensity at the center of the defect may be higher than the emission intensity at the periphery of the defect in some cases or may be lower than the emission intensity at the periphery of the defect in some cases. For example, the micropipe 3 in the first wafer W1 is confirmed as a bright spot and the micropipe 3 in the second wafer W2 is confirmed as a dark spot.

Figure 4:
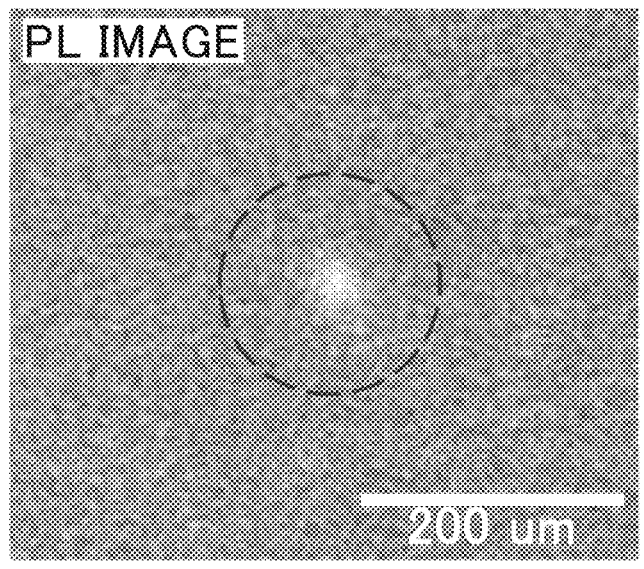
FIG. 4 is an enlarged image of a defect in a photoluminescence image.
Figure 5:
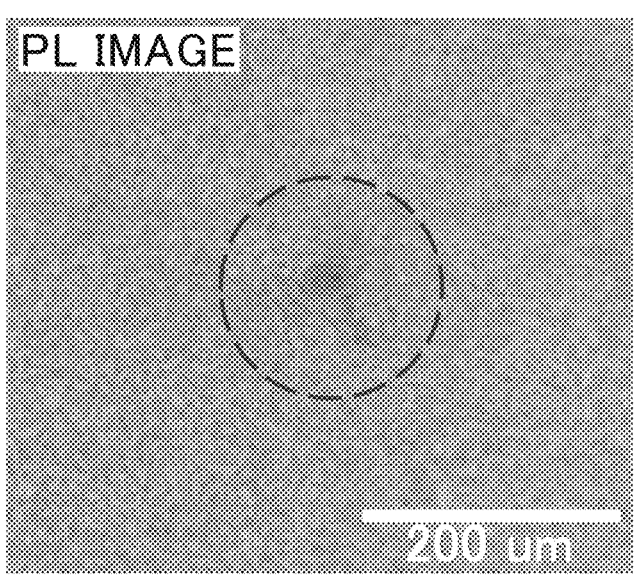
FIG. 5 is a photoluminescence image of a micropipe that is the same as the micropipe in FIG. 4 and located further away from a seed crystal than the micropipe in FIG. 4.

FIGS. 4 and 5 are examples of the photoluminescence image of the micropipe 3. FIG. 4 is a photoluminescence image of the micropipe 3 in the first wafer W1 and FIG. 5 is a photoluminescence image of the micropipe 3 in the second wafer W2.

A photoluminescence image is measured using a photoluminescence method. The photoluminescence method is a method of irradiating a substance with excitation light and measuring light emitted when the exited electrons returns to a ground state. The wafer W is irradiated with excitation light having an energy greater than that of a band gap of SiC and an intensity of photoluminescence emitted from the wafer W is measured. When the photoluminescence method is applied to the wafer W, for example, areas where defects or impurities are concentrated in the wafer W are identified. A photoluminescence inspection can be performed using, for example, an SICA88 manufactured by Lasertec Corporation.

In the photoluminescence inspection, excitation light radiated to the wafer W has a wavelength of, for example, 200 nm or more and 380 nm or less, and preferably 313 nm. Furthermore, at the time of obtaining a photoluminescence image, it is preferable to detect light emitted using the wafer W through a long-pass filter through which light having a wavelength of 600 nm or longer passes.

In the first wafer W1 and the second wafer W2, the micropipe 3 to be measured is the same micropipe 3 extending in the z direction. A determination concerning whether the micropipe 3 in the first wafer W1 and the micropipe 3 in the second wafer W2 are same can be identified from a positional relationship therebetween.

Figure 3:
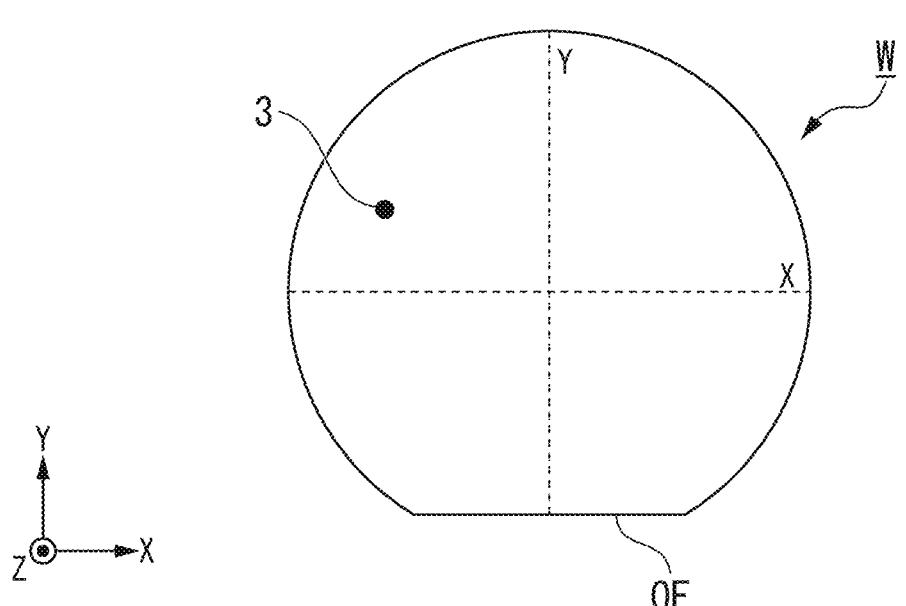
FIG. 3 shows an example of a coordinate system when a position of a defect is extracted from a SiC substrate.

FIG. 3 shows an example of a coordinate system when a position of the micropipe 3 is extracted from the wafer W. A wafer W shown in FIG. 3 has an orientation flat OF. For example, the position of the micropipe 3 is extracted using a direction parallel to the orientation flat OF as the x direction and a direction orthogonal to the x direction as the y direction. The x direction is, for example, [11-20] and the y direction is, for example, [1-100]. When [11-20] and [1-100] are different from a principal plane direction of the wafer W, an x component may be a component in an orthogonal projection direction of [11-20] and a y component may be a component in an orthogonal projection direction of [1-100].

When the position of the micropipe 3 in the first wafer W1 and the position of the micropipe 3 in the second wafer W2 are substantially the same, the micropipes 3 in the wafers W can be specified as originating from the same micropipe 3.

For example, when the seed crystal 1 does not have an offset angle and an inclination angle θ of the micropipe 3 with respect to the z direction of the single crystal 2 is 0°, the position of the micropipe 3 in the first wafer W1 and the position of the micropipe 3 in the second wafer W2 match. Furthermore, for example, when the seed crystal 1 has an offset angle and the micropipe 3 has an inclination angle θ with respect to the z direction, the position of the micropipe 3 in the first wafer W1 and the position of the micropipe 3 in the second wafer W2 are deviated by a value (htan θ) obtained by multiplying a distance h between the first wafer W1 and the second wafer W2 in the z direction by tan θ.

The S/N ratio of the micropipe 3 tends to be larger when the single crystal is in an early stage of crystal growth (closer to the seed crystal 1) and smaller when the single crystal is in a later stage of crystal growth (away from the seed crystal 1). Therefore, as the wafer W is cut out closer to the seed crystal 1, the S/N ratio of the micropipe 3 in the wafer W is higher.

When there are a plurality of micropipes 3 in the single crystal 2, it is preferable that a relationship between the S/N ratios be satisfied in each of the plurality of micropipe 3.

The single crystal 2 may also be doped with impurities in some cases. Examples of the impurities include nitrogen, boron, aluminum, titanium, and vanadium. Concentrations of these impurities vary depending on locations in the single crystal 2.

For example, the total impurity concentration in the first wafer W1 is higher than the total impurity concentration in the second wafer W2. The total impurity concentration in the first wafer W1 is, for example, $1\times10^{14}$ cm$^{-3}$ or more, and the total impurity concentration of the second wafer W2 is, for example, $2\times10^{19}$ cm$^{-3}$ or less. Furthermore, for example, the total impurity concentration in the wafer W is higher as the wafer W is cut out from the vicinity of the seed crystal 1. Here, the total impurity concentration is a total value of the impurities concentrations of nitrogen, boron, aluminum, titanium, and vanadium.

The impurity concentration is one of the parameters which affect the S/N ratio of the micropipe 3. The impurities can be luminescent centers in the photoluminescence inspection. The impurities may be complexed with the micropipe 3 to form complex defects. The complex defects composed of the micropipe 3 and the impurities tend to be a luminescent center in the photoluminescence inspection.

When the total impurity concentration in the first wafer W1 is higher than the total impurity concentration in the second wafer W2, the probability of forming the combination between the micropipe 3 and the impurities on the first wafer W1 increases and the S/N ratio of the first wafer W1 easily increases. On the other hand, in the second wafer W2, the combination is not easily formed and the S/N ratio easily decreases. In the second wafer W2, the surrounding impurities more easily emit light than the micropipe and background luminescence increases. As a result, the S/N ratio of the second wafer W2 easily decreases.

A method of producing the SiC ingot 10 according to the first embodiment will be described below. The SiC ingot 10 is prepared, for example, through a sublimation method. The sublimation method is a method to grow single crystal 2 by sublimating SiC raw material powder placed at a position opposite to seed crystal 1 and recrystallizing SiC on seed crystal 1.

The single crystal 2 is grown so that the impurity concentrations simultaneously satisfy the following first and second conditions.

The first condition is a condition in which a concentration difference between each impurity concentration in a first region on the seed crystal 1 side and each impurity concentration in a second region which is 10 mm or more away from the first region in the z direction satisfies the following relationship at each impurity:

Impurity concentration difference of nitrogen: $1\times10^{18}$ cm$^{-3}$ or more Impurity concentration difference of boron: $3\times10^{16}$ cm$^{-3}$ or more Impurity concentration difference of aluminum: $3\times10^{16}$ cm$^{-3}$ or more Impurity concentration difference of titanium: $1\times10^{16}$ cm$^{-3}$ or more Impurity concentration difference of vanadium: $1\times10^{14}$ cm$^{-3}$ or more.

The second condition is a condition in which, in the single crystal 2, each impurity concentration on the outermost surface on the terminal side of the growth in the z direction satisfies the following relationship at each impurity:

Impurity concentration of nitrogen: $1\times10^{18}$ cm$^{-3}$ or more

Impurity concentration of boron: $1\times10^{15}$ cm$^{-3}$ or more

Impurity concentration of aluminum: $1\times10^{15}$ cm$^{-3}$ or more

Impurity concentration of titanium: $1\times10^{15}$ cm$^{-3}$ or more

Impurity concentration of vanadium: $1\times10^{14}$ cm$^{-3}$ or more.

The first condition and the second condition can be satisfied by adjusting a temperature of a growth plane during crystal growth and an amount of impurities to be supplied during crystal growth.

As an example, there is a method of gradually increasing a temperature of a crystal growth plane in a sublimation method using a raw material containing these impurities. When a temperature of a crystal growth plane gradually increases, an amount of impurities taken into the single crystal 2 gradually decreases.

As another example, in the sublimation method using a raw material containing these impurities, a heating temperature of the raw material may be gradually reduced to gradually reduce an amount of impurities to be released.

It is preferable that temperatures of the crystal growth plane and the raw material can be independently controlled. For example, a heater configured to heat the raw material and a heater configured to heat the single crystal 2 may be separately provided and independently controlled.

Also, as another example, an amount of nitrogen gas to be introduced in the film formation atmosphere may be gradually reduced as the film formation progresses. Furthermore, similarly, when the concentration of any of boron, aluminum, titanium, and vanadium contained in the raw material is $1\times10^{14}$ cm$^{-3}$ or less, these elements may be separately supplied as gases and an amount to be supplied may be controlled in accordance with the progress of film formation.

The SiC ingot 10 is obtained by growing the single crystal 2 on the seed crystal 1 on the basis of the above method. When the SiC ingot 10 is sliced, a plurality of wafers W are obtained.

A photoluminescence inspection on the waters W is performed, for example, before or after marking. The photoluminescence inspection includes a first determination step of performing a comparison of a positional relationship of the micropipe 3 and a second determination step of comparing S/N ratios of the micropipe 3 of two wafers W.

The first determination step is performed to confirm that an evaluation target is a defect based on the same micropipe 3. For example, when the positions to be compared of the micropipe 3 in the two wafers W are htan θ or less, it is determined to be a defect based on the same micropipe 3. Furthermore, when an amount of deviation of the positions of the two micropipes 3 is 0.2 mm or less regardless of the positional relationship to be compared of the two wafers W in the z direction, statistically, these defects are highly likely to be the micropipes 3 which communicate.

The second determination step is performed to specify which wafer W is closer to the seed crystal 1 by comparing the S/N ratios of the micropipes 3 of the two wafers W. When the photoluminescence inspection is performed after marking, a determination concerning whether a mix-up has occurred is performed by comparing a marking history with the result of the second determination step.

The SiC ingot 10 in the first embodiment has a different S/N ratio of the micropipe 3 depending on the position of the cut wafer and has a predetermined relationship with respect to a magnitude of the S/N ratio. Therefore, if the SiC ingot 10 in the first embodiment is used, the positional relationship of different wafers W to the seed crystal 1 can be specified by comparing the S/N ratios of the micropipes 3 between the wafers W. Although a maker is provided to the wafer W for the purpose of manufacturing control in some cases, marking mistakes can be noticed later by comparing the S/N ratios even when a wafer other than a wafer to be marked is marked due to a mistake.

Although examples of embodiments have been illustrated above, the present disclosure is not limited to these embodiments. For example, the characteristic constitutions of the embodiments may be combined or other constitutions may be added.

EXAMPLES

Example 1

A single crystal 2 was grown on a seed crystal 1 to produce a SiC ingot 10. A plurality of wafers W were cut out from the SiC ingot. Furthermore, a first wafer W1 on a side closer to the seed crystal 1 and a second wafer W2 cut out from the single crystal 2 at a position 15 mm further away from the seed crystal 1 than the first wafer W1 were evaluated. A concentration difference between impurities in the first wafer W1 and the second wafer W2 was as follows.

Nitrogen concentration difference: $2 \times 10^{18}$ cm$^{-3}$
Boron concentration difference: $5 \times 10^{16}$ cm$^{-3}$
Aluminum concentration difference: $4 \times 10^{16}$ cm$^{-3}$
Titanium concentration difference: $2 \times 10^{16}$ cm$^{-3}$
Vanadium concentration difference: $5 \times 10^{14}$ cm$^{-3}$ Micropipes 3 at substantially the same position were specified and photoluminescence inspection was performed on the micropipe 3 of each of the first wafer W1 and the second wafer W2.

FIG. 4 is an inspection result of the first wafer W1 and FIG. 5 is an inspection result of the second wafer W2.

An S/N ratio of the micropipe 3 in the first wafer W1 was 1.5 or more and an S/N ratio of the micropipe 3 in the second wafer W2 was 0.75 or less.

What is claimed is:

1. A SiC ingot, comprising:

a seed crystal; and a single crystal grown on the seed crystal, wherein the single crystal has therein one or more micropipes passing through the single crystal in a growth direction, and impurities that are nitrogen, boron, aluminum, titanium, and vanadium, and when photoluminescence observation is performed on a plurality of wafers cut out from the single crystal in a direction intersecting the growth direction, an S/N ratio of the one or more micropipes in a first wafer cut out of the plurality of wafers, which is closest to the seed crystal, is higher than an S/N ratio of the one or more micropipes in a second wafer cut out from a position further away from the seed crystal than the first wafer, the S/N ratio of the one or more micropipes in the first wafer is 1.5 or more, the S/N ratio of the one or more micropipes in the second wafer is 0.75 or less, and wherein a concentration difference between impurity concentrations in a first region corresponding to the first wafer and impurity concentrations in a second region corresponding to the second wafer, which is 10 mm or more away from the first region in the growth direction, satisfies the following relationships:

impurity concentration difference of titanium: $1 \times 10^{16}$ impurity atoms/cm$^3$ or more impurity concentration difference of vanadium: $1 \times 10^{14}$ impurity atoms/cm$^3$ or more, and in the single crystal, impurity concentrations on the outermost surface on the terminal side in the growth direction satisfy the following relationships:

impurity concentration of titanium: $1 \times 10^{15}$ impurity atoms/cm$^3$ or more impurity concentration of vanadium: $1 \times 10^{14}$ impurity atoms/cm$^3$ or more a total impurity concentration of the impurities in the first region is higher than that in the second region, and the total impurity concentration of the first region is $1 \times 10^{14}$ impurity atoms/cm$^3$ or more and the total impurity concentration of the second region is $2 \times 10^{19}$ impurity atoms/cm$^3$ or less.

2. The SiC ingot according to claim 1, wherein the closer the wafer is cut from the seed crystal, the higher the S/N ratio of the one or more micropipes in the wafer is.

3. The SiC ingot according to claim 1, wherein the closer the wafer is cut from the seed crystal, the higher the total impurity concentration in the wafer is.

4. The SiC ingot according to claim 1, wherein a diameter of the single crystal is 150 mm or more.

5. The SiC ingot according to claim 1, wherein a diameter of the single crystal is 200 mm or more.

6. A SiC wafer which is cut out from the SiC ingot according to claim 1.

7. The SiC wafer according to claim 6, wherein the density of the micropipes is 0.003 cm$^{-2}$ or more and 10 cm$^{-2}$ or less.

8. The SiC ingot according to claim 1, wherein the concentration difference between impurity concentrations in the first region and impurity concentrations in the second region satisfies the following relationships:

impurity concentration difference of nitrogen: $1 \times 10^{18}$ impurity atoms/cm$^3$ or more, impurity concentration difference of boron: $3 \times 10^{16}$ impurity atoms/cm$^3$ or more, and impurity concentration difference of aluminum: $3 \times 10^{16}$ impurity atoms/cm$^3$ or more, and in the single crystal, impurity concentrations on the outermost surface on the terminal side in the growth direction satisfy the following relationships:

impurity concentration of nitrogen: $1 \times 10^{18}$ impurity atoms/cm$^3$ or more, impurity concentration of boron: $1 \times 10^{15}$ impurity atoms/cm$^3$ or more, and impurity concentration of aluminum: $1 \times 10^{15}$ impurity atoms/cm$^3$ or more.

* * * * *